(12) United States Patent
Crisan et al.

(10) Patent No.: US 7,491,678 B2
(45) Date of Patent: Feb. 17, 2009

(54) SUPERCONDUCTING THIN FILM HAVING COLUMNAR PIN RETAINING CENTER USING NANO-DOTS

(75) Inventors: Ioan Adrian Crisan, Tsukuba (JP); Hideo Ihara, Tsukuba (JP); Yoshiko Ihara, legal representative, Tsukuba (JP); Hideyo Ihara, legal representative, Bunkyo-ku (JP); Hidetaka Ihara, legal representative, Bunkyo-ku (JP); Gen-ei Ihara, legal representative, Takamatsu (JP); Chiaki Ihara, legal representative, Kita-machi (JP)

(73) Assignees: Japan Science and Technology Agency, Saitama (JP); National Institute of Advanced Industrial Science and Technology, Tokyo (JP)

( * ) Notice: Subject to any disclaimer, the term of this patent is extended or adjusted under 35 U.S.C. 154(b) by 424 days.

(21) Appl. No.: 10/480,942

(22) PCT Filed: Jun. 17, 2002

(86) PCT No.: PCT/JP02/06007
§ 371 (c)(1),
(2), (4) Date: May 12, 2004

(87) PCT Pub. No.: WO02/103815
PCT Pub. Date: Dec. 27, 2002

(65) Prior Publication Data
US 2004/0235670 A1    Nov. 25, 2004

(30) Foreign Application Priority Data
Jun. 19, 2001    (JP) .............................. 2001-185597

(51) Int. Cl.
*H01L 39/12* (2006.01)
*H01B 12/00* (2006.01)
*B05D 5/12* (2006.01)

(52) U.S. Cl. ....................... 505/238; 505/237; 505/475; 427/62; 427/287

(58) Field of Classification Search ......... 505/235–239, 505/475, 477, 816; 427/62, 287
See application file for complete search history.

(56) References Cited

U.S. PATENT DOCUMENTS 5,446,016 A * 8/1995 Tanaka et al. ............... 505/329
5,897,945 A    4/1999 Lieber et al.

FOREIGN PATENT DOCUMENTS

EP    0 553 593    8/1993
(Continued)

OTHER PUBLICATIONS

Crisan et al "Sputtered nanodots: A costless method for inducing effective pinning centers in superconducting thin films", Applied Physica Letters 79(27), pp. 4547-4549 Dec. 31, 2001.*
(Continued)

*Primary Examiner*—Mark Kopec
(74) *Attorney, Agent, or Firm*—Westerman, Hattori, Daniels & Adrian, LLP.

(57) ABSTRACT

A superconducting thin film is disclosed having columnar pinning centers utilizing nano dots, and comprising nano dots (3) which are formed insularly on a substrate (2) and three-dimensionally in shape and composed of a material other than a superconducting material and also other than a material of which the substrate is formed, columnar defects (4) composed of the superconducting material and grown on the nano dots (3), respectively, a lattice defect (6) formed on a said columnar defect (4), and a thin film of the superconducting material (5) formed in those areas on the substrate which are other than those where said columnar defects are formed. The superconducting thin film is prepared by depositing the material other than the superconducting material on the substrate (2) while controlling the substrate temperature, the rate of deposition of the material and the film thickness of the material deposited so to coagulate the deposited material to form the nano dots (3), and then growing a thin film of the superconducting material (5) on the substrate (2). An improved superconducting this film is thus provided which regardless of its type is at least ten times higher in critical current density than an exiting superconducting thin film, and which can also be manufactured at a low cost. And, being large in critical superconducting current density and critical superconducting magnetic field, it is advantageously applicable to the technical fields of cryogenic electronics and microwaves.

6 Claims, 4 Drawing Sheets

FOREIGN PATENT DOCUMENTS

| | | |
|---|---|---|
| EP | 0 553 593 A1 | 8/1993 |
| JP | 2-237179 | 9/1990 |
| JP | 2-253516 | 10/1990 |
| JP | 5-148084 | 6/1993 |
| WO | WO 99/65821 A1 | 12/1999 |

OTHER PUBLICATIONS

Baert et al "Composite Flux-Line Lattices Stabilized in Superconducting Films by a Regular Array of Artificial Defects", Physical Review Letters, 74(16), 3269-72 Apr. 17, 1995.*

Goyal et al "Irradiation-free, columnar defects comprised of self-assembled nanodots and nanorods . . . ", Supercond. Sci. Technol. 2005 18, 1533-38 (Abstract Only).*

Miura et al "Critical Current Density Characteristics in YBCO Films on MgO Substrates by Pulsed Laser Deposition", IEEE Transaction on Applied Superconductivity pp. 1-4 (2005).*

Adrian Crisan et al.; ISEC'01 8$^{TH}$ International Super-conductive Electronics Conference Extended Abstract, pp. 443-444, Jun. 19-20, 2001. Cited in the int'l. search report.

European Office Action dated Oct. 23, 2006, issued in European Application No. 02 736 128.6.

Huijbregtse J M et al.: "Natural strong pinning sites in laser-ablated $YBa_2Cu_3O_{7-d}$ thin films", Physical Review B, vol. 62 No. 2, Jul. 1, 2000, pp. 1338-1349.

B. Dam et al.: "Controlling the natural strong pinning sites in laser ablated $YBa_2Cu_3O_{7-d}$ thin films", Physical C, vol. 341-348, Nov. 2000, pp. 2327-2330.

Z.L. Wang et al.: "Growth-induced columnar defects in $YBa_2Cu_3O_{7-x}$ thin films", grown on miscut mosaic LaAIO3 (001), Physica C, vol. 252, No. 1-2, Oct. 1, 1995, pp. 125-137.

P. Yang et al.: Columnar defect formation in nanorod/ $TI_2Ba_2Ca_2Cu_3Oz$ superconducting composites, Aplied Physics Letters, vol. 70, No. 23, Jun. 9, 1997, pp. 3158-3160.

Supplementary European Search Report dated Jun. 26, 2006 of European Application No. 02736128.6.

A. Buzdin et al.: "Electromagnetic pinning of vortices on different types of defects", Physica C vol. 294 (1998) pp. 257-269.

M. Bert et al.: "Composite Flux-Line Lattices Stabilized in Superconducting Films by a Regular Array of Artificial Defects", Physical Review Etters, vol. 74, No. 16, Apr. 17, 1995, pp. 3269-3272.

L. Civale et al.: Vortex Confinement by Columnar Defects in $YBa_2Cu_3O_7$ Crystals: Enhanced Pinning at High Fields and Temperatures, Physical Review Letters, vol. 67, No. 5, Jul. 29, 1991, pp. 648-651.

European Office Action dated Oct. 9, 2007 issued in corresponding Application No. 02 736 128.6-2222.

V.M. Pan et al., Effect of Growth-Induced Linear Defects on High-Frequency Properties of Pulse-Laser Deposited $YBa_2Cu_3O_7.\delta$ Films, Journal of Superconductivity: Incorporating Novel Magnetism, vol. 14, No. 1, 2001, pp. 105-114.

C.S. Pande et al., Grain Boundary and Grain Size Effects in High and Low Transition Temperature Superconductors, Materials Science and Engineering, vol. B32, 1995, pp. 247-253.

* cited by examiner

SUPERCONDUCTING THIN FILM HAVING COLUMNAR PIN RETAINING CENTER USING NANO-DOTS

TECHNICAL FIELD

The present invention relates to a superconducting thin film that is large in critical superconducting current density and critical superconducting magnetic field, which is advantageously applicable to the technical fields of cryogenic electronics and microwaves. The invention also relates to a method of making such a superconducting thin film.

BACKGROUND ART

In the past, columnar or extended pinning centers could be created in a superconducting thin film only through irradiation with a high energy beam of neutrons or heavy ions (see L. Civale et al., Physical Review Letters 67 No. 5, 648, 1991). According to this method, a material damaged by irradiation with a high energy beam of neutrons or heavy ions is arrayed regularly to form extremely effective columnar pinning centers, namely columnar or extended defects which enhance its critical current density and critical magnetic field. Theoretically, it has been proven by A. Buzdin and M. Daumens (see Physica C, 294, 297, 1998) that a highest pinning effect is achieved if the columnar defect is cross-sectionally in the form of an elongate ellipse, namely if it is in the form of a thin stripe. In order to form such a columnar or extended defect, it is necessary to irradiate a substrate with a heavy ion beam at an angle lower than 90 degrees to its surface.

It has now been known that pinning centers can also be formed in a superconducting thin film by photolithography and lift-off techniques to create a regular array of dots or holes (see M. Baert et al., Physical Review Letters, 74, 3269, 1995).

The abovementioned method of driving a high energy beam of neutrons or heavy ions into is recognized to be extremely useful in making a superconducting thin film with high critical current density, but it requires an accelerator for high energy particles and thus has the problem that its practice is very costly.

Columnar defects having a striped cross section and formed by irradiating a substrate with heavy ions at a low angle have their axes inclined to the c-axis of a superconducting thin film and also deviated from a direction in which a magnetic field is applied generally. Then, for defects to be pinned, it is necessary to tilt the direction of magnetic flux, which causes the pinning free energy to be decreased, however. This is the reason why defects of this type are only effective in a small magnetic field.

On the other hand, a regular array of dots or holes formed by utilizing photolithography or lift-off is not much effective for the reasons as follows. First, their size is larger than 0.1 μm and their length is longer than the superconducting coherence length. Second, their surface density is small and the distance between adjacent dots or holes is 1 μm or more. Under these conditions, it is only in a magnetic field as low as 1 mT that the critical current density can be increased.

DISCLOSURE OF THE INVENTION

In view of the aforementioned problems in the prior art, the present invention has for its object to provide a method whereby a superconducting thin film regardless of its type can be prepared exhibiting an increased critical current density that is at least ten times higher than that which an existing superconducting thin film does and further at a low cost.

In order to achieve the object mentioned above, there is provided in accordance with the present invention a superconducting thin film having columnar pinning centers utilizing nano dots, characterized in that it comprises a substrate; nano dots or nano stripes which are formed insularly on the substrate and three-dimensionally in shape and composed of a material other than a superconducting material and also other than a material of which the substrate is formed; columnar or extended defects composed of the said superconducting material which are grown on the said nano dots or nano stripes respectively, possibly with a lattice defect; and a thin film of the said superconducting material formed in those areas on the said substrate which are other than those where the said columnar defects are formed.

With the superconducting thin film so structured, the columnar or extended defects on the three-dimensionally shaped nano dots or nano stripes and possibly also the lattice defects on such nano dots or stripes serve as pinning centers to pin a magnetic flux and thereby to make it immobile, thus leading to a sharp rise in the critical current density and critical magnetic field which a superconducting thin film exhibits.

In the abovementioned structure of the superconducting thin film, the said material other than a superconducting material and also other than a material of which the substrate is formed is preferably a metal, an insulator, a semiconductor or a ferromagnetic material. With the superconducting thin film so constituted, the columnar defects which are non-superconducting and formed on the three-dimensionally shaped nano dots or nano stripes act to pin the magnetic flux. If the material is ferromagnetic, then there is added energy by the interaction of the magnetic flux and the magnetization of the ferromagnetic material, and the magnetic flux is even more firmly pinned thereby.

In the aforementioned structure of the superconducting thin film, preferably the said nano dots which are three-dimensional in shape are 20 nm or less in diameter and 6 nm or so in height and, being spaced apart from one another by an average distance of 50 nm or less are irregularly or randomly distributed on the said substrate. With the superconducting thin film so constructed, the effect of pinning the magnetic flux is augmented whereby both the critical current density and the critical magnetic field are increased.

In the aforementioned structure of the superconducting thin film, preferably the said nano stripes which are three-dimensional in shape are formed, each in the form of a stripe, along flanks of steps formed on the said substrate which is a substrate formed so that its facial orientation is inclined to its crystallographic axis. With the superconducting thin film so constructed, the columnar defect is formed on the nano stripe so that its cross section parallel to the substrate surface is a plane in the form of an elongate ellipse. As a result, there is the increased interaction energy between the magnetic flux and columnar defects, and the magnetic flux is even still more firmly pinned thereby.

In the aforementioned structure of the superconducting thin film, specifically a said columnar defect is of an amorphous body composed of said superconducting material, a non-superconductor, or a superconductor of low critical temperature, and it is formed columnarly perpendicular to a surface of the said substrate. According to this specific makeup, the columnar defects are non-superconducting to permit a magnetic flux to enter, and act as pin centers to pin the magnetic flux.

Also, the said lattice defect may comprise a crystal dislocation of the superconducting material forming the said thin film. According to this makeup, if the columnar defects are thinner in thickness than the thin film of the superconducting material, the pin centers are still provided, served by the crystal defects, e.g., dislocations, on the columnar defects.

In the aforementioned structure of the superconducting thin film, the said substrate may be a substrate of $SrTiO_3$, MgO or $Al_2O_3$, or a substrate having a buffer layer of $CeO_2$ formed thereon; the said material other than the said superconducting material may be Ag, Mg or Zn; and the said thin film may be a thin film composed of a superconductor that can be expressed by composition formula:

$$(Cu_{1-x}Tl_x)Ba_{1-y}Sr_yCa_2Cu_3O_z \text{ where } 0 \leq x \leq 1, 0 \leq y \leq 1, \text{ and } 0 < z.$$

Further, the said thin film may be a thin film composed of a selective reduction type high temperature superconductor that is of a (Cu, M) high temperature superconducting material which can be expressed by the following composition formula:

$$Cu_{1-x}M_x(Ba_{1-y}Sr_y)_2(Ca_{1-z}L_z)_{n-1}Cu_nO_{2n+4-w}$$

where M represents one or more metallic elements in an ionic form selected from the group that consists of Tl, Bi, Pb, Hg, In, Ga, Sn, Ti, V, Cr, Mn, Fe, Co, Ni, Zr, Nb, Mo, W, Re and Os; and L represents one or more elements selected from the group that consists of Mg and alkali metal elements, and where $0 \leq x \leq 1.0$, $0 \leq y \leq 1.0$, $0 \leq z \leq 1$, $0 \leq w \leq 4$, and $1 \leq n \leq 16$.

In these cases, it is possible to increase to about ten times higher the critical current density which a superconducting thin film of a selective reduction type high temperature superconductor such as $(Cu_{1-x}Tl_x)Ba_{1-y}Sr_yCa_2Cu_3O_z$ or $Cu_{1-x}M_x(Ba_{1-y}Sr_y)_2(Ca_{1-z}L_z)_{n-1}Cu_nO_{2n+4-w}$ superconductor exhibits.

The present invention also provides a method of making a superconducting thin film having columnar pinning centers utilizing nano dots, characterized in that it comprises the steps of forming insularly on a substrate, nano dots or nano stripes shaped three dimensionally and composed of a material other than a superconducting material and also other than a material of which the substrate is formed, and growing on the said substrate a thin film composed of the said superconducting material. According to this method makeup, a columnar defect of an amorphous or non-superconducting material is allowed to form on each of nano dots or nano stripes distributed insularly on a substrate, possibly also with a crystal dislocation allowed to form on such a columnar defect whereby such a columnar defect or a dislocation becomes a pinning center in the superconducting thin film.

In the aforementioned method makeup, specifically the said nano dots shaped three-dimensionally and composed of a material other than the said superconducting material are formed by depositing the said material insularly on the said substrate by a technique selected from the group which consists of sputtering, vaporization, laser ablation, CVD and MBE while controlling the substrate temperature, the deposition rate of the said material and the film thickness of the said material deposited, thereby coagulating the deposited material on the said substrate to form the said three-dimensionally shaped nano dots insularly thereon. According to this method makeup, nano dots can be formed which are 20 nm or less in diameter and 6 nm or less in height and, being spaced apart from one another by an average distance of 50 nm or less, are irregularly or randomly distributed on the substrate.

In the aforementioned method makeup, specifically the said nano stripes shaped three-dimensionally and composed of a material other than the said superconducting material are formed by forming a substrate so that its facial orientation is inclined to its crystallographic axis, and depositing the said material insularly on the said substrate by a technique selected from the group which consists of sputtering, vaporization, laser ablation, CVD and MBE while controlling the substrate temperature, the deposition rate of the said material and the film thickness of the said material deposited, thereby permitting the deposited material on the said substrate to selectively grow in regions of steps formed thereon and thereby to form the said three-dimensionally shaped nano stripes insularly on the said substrate. This method makes it possible to create the nano stripes which are formed along flanks of the steps and have the elongated elliptic cross section parallel to the substrate surface.

Also, the said thin film of the superconducting material is grown on said substrate specifically by crystal growth of the said superconducting material, by way of a technique selected from the group which consists of sputtering, vaporization, laser ablation, CVD and MBE, on the said substrate having the said nano dots or nano stripes formed thereon.

Alternatively, the said thin film of the superconducting material is grown on said substrate specifically by crystal growth of the said superconducting material, by way of amorphous phase epitaxial process, on the said substrate having the said nano dots or nano stripes formed thereon. This method makes it possible to create the superconducting thin films of $(Cu,Tl)Ba_2SrCa_2Cu_3O_y$ having the pinning centers.

According to the present invention, a superconducting thin film is obtained which is high in both critical superconducting current density and magnetic filed, and such a superconducting thin film can be manufactured at low cost.

BRIEF DESCRIPTION OF THE DRAWINGS

The present invention will better be understood from the following detailed description and the drawings attached hereto showing certain illustrative forms of implementation of the present invention. In this connection, it should be noted that such forms of implementation illustrated in the accompanying drawings hereof are intended in no way to limit the present invention but to facilitate an explanation and understanding thereof. In the drawings.

BEST MODES FOR CARRYING OUT THE INVENTIONS

Figure 1:
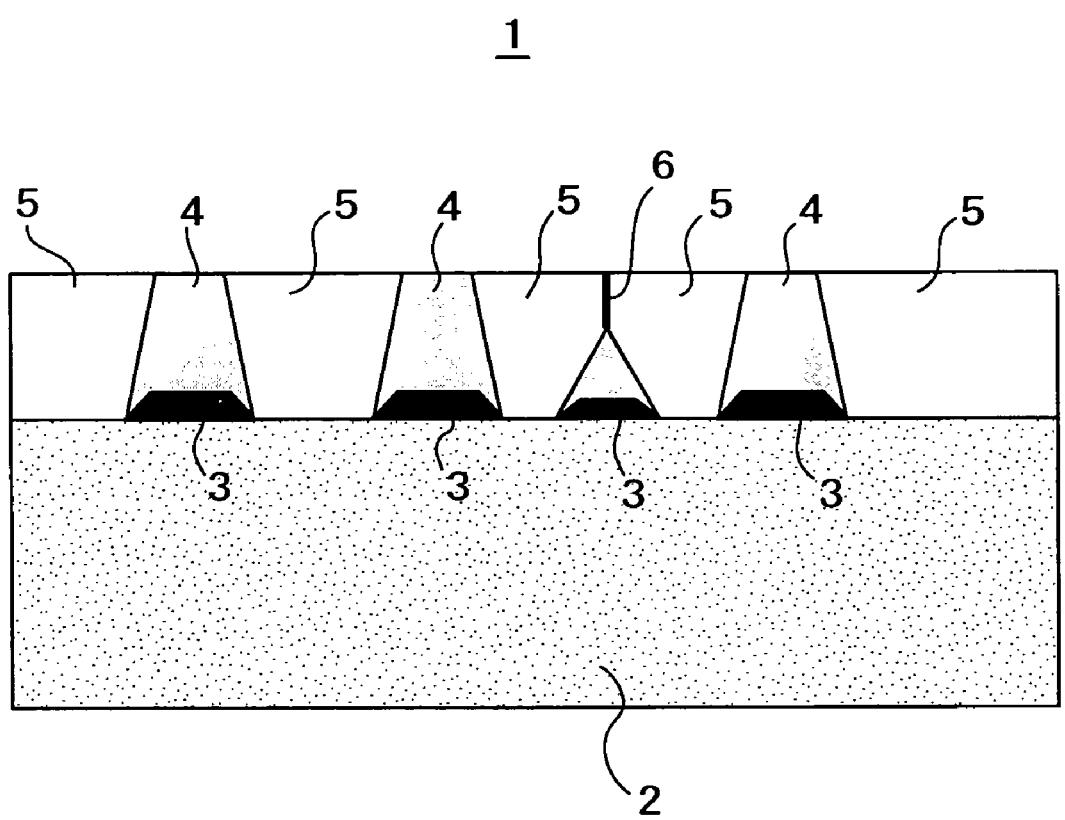
FIG. 1 is a cross sectional view illustrating the structure of a superconducting thin film having pinning centers formed from nano dots in accordance with the present invention.

Hereinafter, the present invention will be described in detail with reference to certain suitable forms of implementation thereof illustrated in the drawing figures.

At the outset, mention is made of a first form of implementation of the present invention. FIG. 1 is a cross sectional view illustrating the structure of a superconducting thin film having pinning centers formed from nano dots in accordance with the present invention. In the Figure, a superconducting thin film 1 having pinning centers is here structured to comprise a substrate 2, nano dots 3 formed on the substrate 2, columnar (or extended) defects 4 formed on the nano dots 3, respectively, and a thin film of superconductor 5 formed in those areas on the substrate 2 other than where the columnar defects 4 are formed. Further, a dislocation 6 may also be formed as extending from a columnar defect 4.

The nano dots 3 are composed of a material other than those of which the substrate 2 and the superconducting thin film 5 and may be, for example, a metal, an insulator, a semiconductor or a ferromagnetic material. The nano dots 3 are 20 nm (nanometers) or less in diameter and around 6 nm in height, and are irregularly or randomly distributed on the substrate 2 as they are spaced apart from one another by a mean distance of 50 nm or less. Each columnar defect 4 is in the form of a column having its basal plane formed by a nano dot 3 and having its axis extending perpendicular to the surface of the substrate 2. The columnar defect 4 is an amorphous body composed of a superconducting material; a non-superconductor; or a low critical temperature superconductor. The lattice defect 6 is a crystal dislocation of the superconducting material forming the thin film.

According to this makeup, an applied magnetic flux enters the columnar defect 4 on the nano dot 3 because of the columnar defect 4 being a non-superconductor and is pinned. Even if the columnar defect 4 does not reach the surface of the thin film of superconductor 5, the magnetic flux is pinned by the crystal dislocations 6 each extending from the top of a columnar defect 4. If the nano dots are of a ferromagnetic material, there is the added interaction energy between the magnetic flux and the magnetization of the ferromagnetic material, and hence the magnetic flux is even more firmly pinned thereby.

Since the columnar defects 4 each formed on a nano dot 3 are each of a columnar shape of nano size reflecting the columnar shape of a nano dot 3 having its axis perpendicular to the substrate surface and, being spaced apart from one another by a distance or 50 nm or less, are distributed irregularly or randomly over the substrate 2, their magnetic flux pinning effect is large and the superconductivity of the thin film is thus not broken even by its high superconducting current density under an increased magnetic field.

Mention is next made of a second form of implementation of the present invention.

Figure 2:
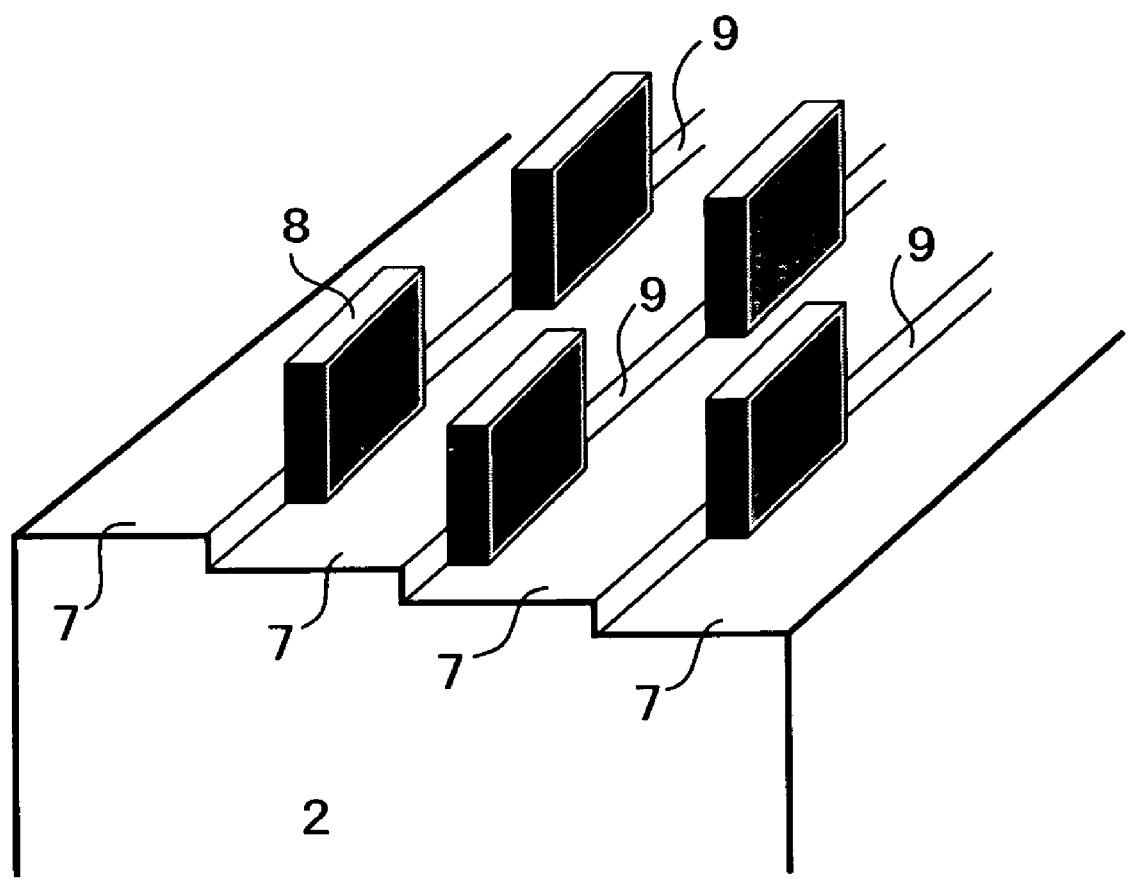
FIG. 2 is a transverse cross sectional view illustrating the arrangement of nano stripes according to the present invention.

FIG. 2 is a transverse cross sectional view illustrating the makeup of nano stripes of a superconducting thin film having pinning centers according to the present invention. The Figure shows the shape and distribution of nano stripes 8 formed on surfaces 7 of steps. The nano stripes 8 are each in the form of a thin stripe of nanometer size formed along a flank 9 of a step and, being spaced apart from one another by a distance of 50 nm or less, are irregularly or randomly distributed.

As in the form of implementation shown in FIG. 1 for the nano dots, the nano stripes 8 are composed of a material other than those of which the substrate 2 and a thin film of superconductor 5 are composed, which material may be a metal, an insulator, a semiconductor or a ferromagnetic material. A columnar defect is formed on each of the nano stripes 8, and the thin film of superconductor is formed in those areas on the substrate other than where the columnar defects are formed.

According to this makeup, since columnar defects are formed each having a shape in cross section that is an elongate ellipse or being a thin stripe, the magnetic flux pinning effect is further enhanced.

Mention is next made of a method of making a superconducting thin film having pinning centers in accordance with the present invention.

Mention is first made of a method of making a superconducting thin film having pinning centers formed from nano dots.

The method of making a superconducting thin film having pinning centers formed from nano dots comprises depositing a material other than superconductors on a substrate by using sputtering, evaporation, laser ablation, CVD (chemical vapor deposition), or MBE (molecular beam epitaxy) while controlling the substrate temperature, the deposition rate of the material and the film thickness of the material deposited, thereby coagulating the deposited material on the substrate to form three-dimensional nano dots insularly thereon. This process allows the nano dots having a diameter of 20 nm or less and a height of 6 nm or so and spaced apart by an average distance of 50 nm or less to be easily formed as they are irregularly or randomly distributed on the substrate.

Next, a superconducting material is grown by crystal growth of the superconducting material on the substrate having the nano dots formed thereon by way of sputtering, vaporization, laser ablation, CVD, MBE or the like technique. This process allows the superconducting material grown on the nano dots to form amorphous or non-superconducting columnar defects and the superconducting material to be grown on those areas on the substrate other than where the nano dots have been formed to form a thin film of superconductor. Alternatively, an amorphous epitaxial process as described in JP Patent No. 2,923,530 may be used to form such a thin film of superconductor.

According to this method, a superconducting thin film can be obtained having pinning centers formed from nano dots in accordance with the present invention.

Mention is next made of a method of forming a superconducting thin film having pinning centers formed from nano stripes.

The method of forming a superconducting thin film having pinning centers formed from nano stripes makes use of a crystallographically inclined substrate that is formed so that its facial orientation is inclined to its crystallographic axis. The angle of inclination may range between several and 10 degrees. Cutting out with such an inclination allows incremental steps each in the order of a molecular layer to be formed on the inclined substrate surface. Alternatively, such the substrate having incremental steps in the order of a molecular layer may be formed by heat-treating a substrate cut out with an inclination under suitable conditions.

Then, a material other than superconductors is deposited on a substrate having steps so formed, by sputtering, vaporization, laser ablation, CVD or MBE while controlling the substrate temperature, he deposition rate of the material and the film thickness of the material deposited, to form nano stripes, each in the form of a stripe of nano size, in regions of flanks of the steps along the flanks.

Next, a superconducting material is grown by crystal growth on the substrate having the nano stripes formed thereon, by sputtering, vaporization, laser ablation, CVD, or MBE. Alternatively, the amorphous epitaxial process mentioned above may be used to form such a superconducting thin film.

This process allows the superconducting material grown on the nano stripes to form amorphous or non-superconducting columnar defects and the superconducting materials grown on those areas on the substrate other than where the nano stripes have been formed to form a thin film of superconductor.

Mention is next made of a specific example of the superconducting thin film having pinning centers formed from nano dots.

Ag is used to make up nano dots. Using a RF (radio-frequency) sputtering apparatus, Ag nano dots are deposited on a single crystal substrate of SrTiO$_3$ held at a temperature of 50° C., by sputtering from a Ag target at a sputtering power of 10 W, with an Ar gas pressure of 6.3 Torr, and in a sputtering time period of 3 to 5 seconds. The sputtering apparatus is an off-axis sputtering apparatus in which the target plane is placed orthogonal to the substrate surface.

Figure 3:
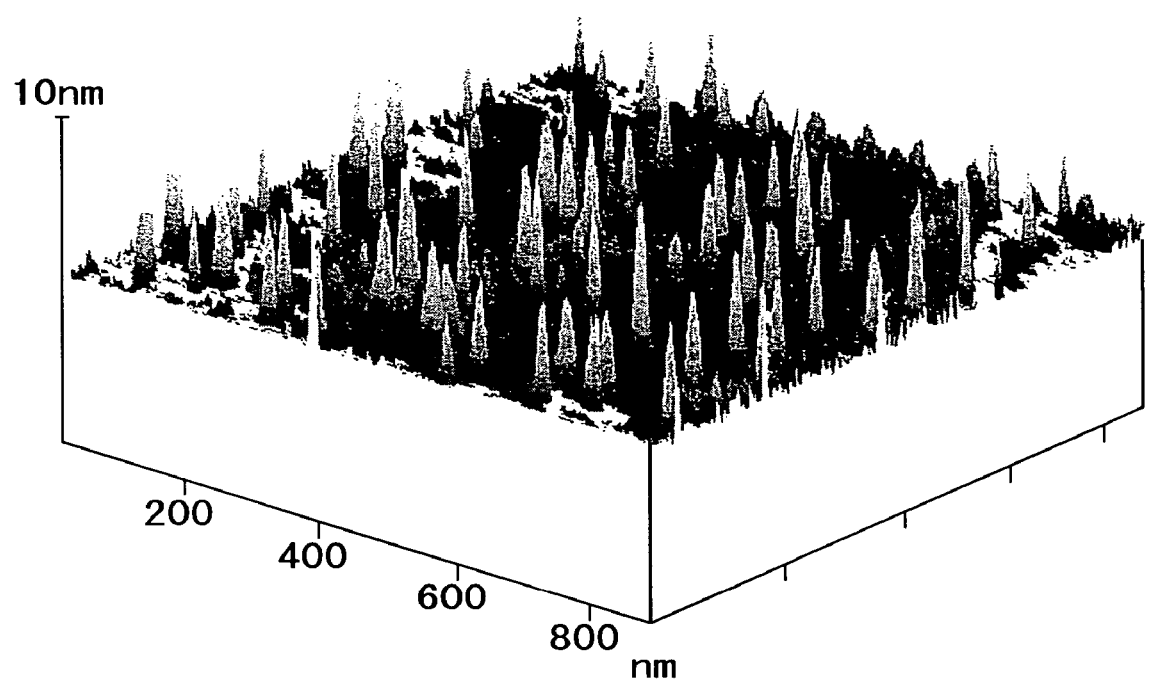
FIG. 3 is a view illustrating an AFM image of Ag nano dots formed on a $SrTiO_3$ single crystal substrate.

FIG. 3 is a view showing an image taken by an AFM (atomic force Microscope) of the Ag nano dots formed on the SrTiO$_3$ single crystal substrate. As is apparent from this view, it is seen that the Ag nano dots have diameters of 10 to 20 nm and heights not more than 5 to 6 nm and, being spaced apart from one another by an average distance of 50 nm, are irregularly or randomly distributed. These dimensions and average distances are far much smaller than those of the nano dots prepared by photolithography in the prior art. It should also be noted that the size and surface density of nano dots are strongly dependent on the deposition time and the substrate temperature.

Next, a superconducting thin film is grown on the substrate having the nano dots formed thereon. For its growth, use is made of APE (amorphous phase epitaxy). The process of growth of a superconducting thin film by APE is shown below.

Using the RF sputtering apparatus, an amorphous film as a superconductor precursor is deposited on the substrate having the Ag nano dots formed thereon, by sputtering from a sputtering target having a metallic composition of TlBaSrCa$_2$Cu$_4$ in a sputtering atmosphere with an Ar pressure of 25 mTorr and an O$_2$ pressure of 5 mTorr by sputtering power 100 W for 120 min., to a film thickness of 530 nm. To obtain a comparative specimen, such an amorphous film is also deposited on a SrTiO$_3$ single crystal substrate which has no Ag nano dots.

Next, the substrate and the comparative specimen substrate each having the superconductor precursor amorphous film formed thereon are enclosed in a sealed vessel made of Ag and subjected to a crystal growth process in a suitable Tl and O$_2$ atmosphere at a temperature of 845° C. and in a time period of 60 minutes, each to form a superconducting thin film thereon.

Upon X-ray diffraction measurement, this superconducting thin film was found to be a (Cu, Tl)Ba$_2$SrCa$_2$Cu$_3$O$_y$ superconductor.

The critical temperature was 104 K for both the superconducting thin film with the Ag nano dots and the superconducting thin film of the comparative specimen without the Ag nano dots.

Figure 4:
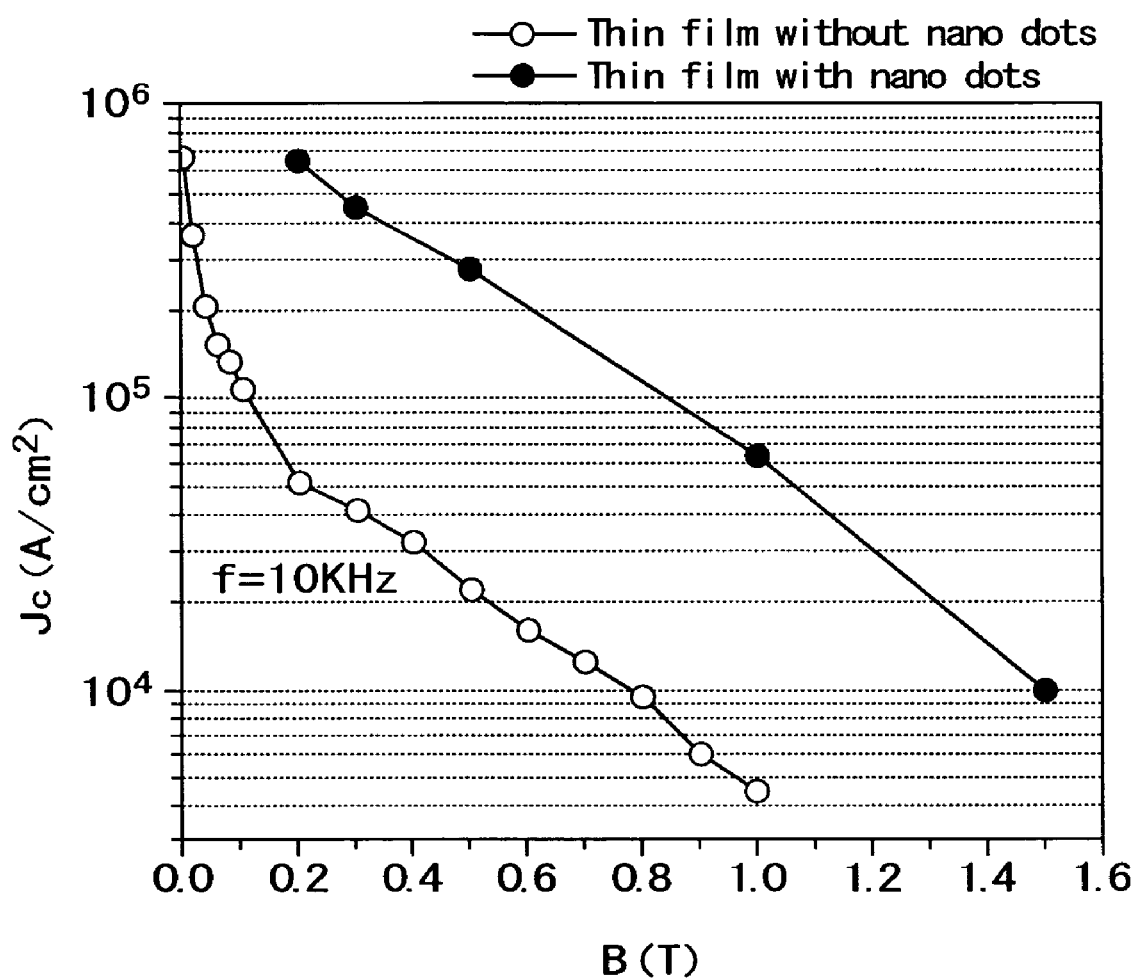
FIG. 4 is a graph illustrating, as results of measurement, the dependency of critical current density on magnetic filed for a superconducting thin film having Ag nano dots and a superconducting thin film not provided with Ag nano dots.

The dependency of the critical current density on the magnetic field of each of the superconducting thin film with the Ag nano dots and of the superconducting thin film without the Ag nano dots was measured. The results are shown in the graph of FIG. 4. The measurement was made by an AC susceptibility measurement, by using PPMS Model 6000, manufactured by Quantum Design Company. In the graph, the abscissa axis indicates the intensity of the magnetic field applied and the ordinate axis indicates the critical current density. The measurement temperature was 77.8 K.

As is apparent from the graph, it is seen that the superconducting thin film with the Ag nano dots is more than ten times higher in critical current density (Jc) than the superconducting thin film without the Ag nano dots over an applied magnetic field intensity of 1. 5 T.

It will also be apparent that the present invention is applicable to a selective reduction high temperature superconductor which is a Cu oxide high temperature superconductor, possible of positive hole doping by selective reduction of the constituent element as disclosed in PCT Application No. PCT/JP00/01669, and is a (Cu, M) high temperature superconducting material that can be expressed by the following composition formula: $Cu_{1-x}M_x(Ba_{1-y}Sr_y)_2(Ca_{1-z}L_z)_{n-1}CU_nO_{2n+4-w}$ where M represents one or more metallic elements in an ionic form, the elements being selected from the group which consists of Tl, Bi, Pb, Hg, In, Ga, Sn, Ti, V, Cr, Mn, Fe, Co, Ni, Zr, Nb, Mo, W, Re and Os, and L represents one or more elements selected from the group which consists of Mg and alkali metal elements, and where $0 \leq x \leq 1.0$, $0 \leq y \leq 1.0$, $0 \leq z \leq 1$, $0 \leq w \leq 4$, and $1 \leq n \leq 16$.

INDUSTRIAL APPLICABILITY

The present invention thus provides an improved superconducting thin film which regardless of its type is at least ten times higher in critical current density than an exiting superconducting thin film and also provides a method of manufacture whereby the improved superconductor can be made quite inexpensively. Therefore, a superconducting thin film thus obtained is extremely useful as applied to the technical fields of cryogenic electronics and microwaves.

What is claimed is:

1. A superconducting thin film structure having columnar pinning centers and comprising:
   a substrate,
   nano dots or nano stripes which are formed insularly on the substrate and three-dimensionally in shape, said nano dots or nano stripes comprising a material selected from the group consisting of Ag, Mg and Zn,
   amorphous or non-superconducting columnar defects composed of a superconducting material and grown on said nano dots or nano stripes, respectively, and
   a superconducting thin film composed of said superconducting material formed in those areas on said substrate which are other than those where said columnar defects are formed;
   wherein said substrate is a substrate of SrTiO$_3$, MgO or Al$_2$O$_3$, or a substrate having a buffer layer of CeO$_2$ formed thereon; and
   said superconducting thin film is a superconducting thin film that can be expressed by composition formula: $(Cu_{1-x}Tl_x)Ba_{1-y}Sr_yCa_2Cu_3O_z$ where $0 \leq x \leq 1$, $0 \leq y \leq 1$, and $0 < z$.

2. A superconducting thin film structure having columnar pinning centers and comprising:
   a substrate,
   nano dots or nano stripes which are formed insularly on the substrate and three-dimensionally in shape and composed of a material other than a superconducting material and also other than a material of which the substrate is formed,
   amorphous or non-superconducting columnar defects composed of a superconducting material and grown on said nano dots or nano stripes, respectively, and
   a superconducting thin film composed of said superconducting material formed in those areas on said substrate which are other than those where said columnar defects are formed;
   wherein said substrate is a substrate of SrTiO$_3$, MgO or Al$_2$O$_3$, or a substrate having a buffer layer of CeO$_2$ formed thereon; said material being other than said superconducting material is Ag, Mg or Zn; and
   said superconducting thin film is composed of a selective reduction type high temperature superconductor that is a (Cu, M) high temperature superconducting material which can be expressed by the following composition formula:

$Cu_{1-x}M_x(Ba_{1-y}Sr_y)_2(Ca_{1-z}L_z)_{n-1}Cu_nO_{2n+4-w}$ where M represents one or more metallic elements in an ionic form selected from the group that consists of Tl, Bi, Pb, Hg, In, Ga, Sn, Ti, V, Cr, Mn, Fe, Co, Ni, Zr, Nb, Mo, W, Re and Os; and L represents one or more elements selected from the group that consists of Mg and alkali metal elements, and where $0 \leq x \leq 1.0$, $0 \leq y \leq 1.0$, $0z \leq 1$, $0 \leq w \leq 4$, and $1 \leq n \leq 16$.

3. A method of making a superconducting thin film structure having columnar pinning centers comprising the steps of forming insularly on a substrate, nano dots or nano stripes shaped three-dimensionally;

said nano dots or nano stripes comprising a material selected from the group consisting of Ag, Mg and Zn, depositing a superconducting material on said substrate and on said nano dots or said nano stripes to form amorphous or non-superconducting columnar defects on said nano dots or nano stripes and to form superconducting thin film on those areas on the substrate other than where said nano dots or nano stripes have been formed:

wherein said substrate is the substrate of $SrTiO_3$, MgO, or $Al_2O_3$, or a substrate having a buffer layer of $CeO_2$ formed thereon; and said superconducting thin film is a superconducting thin film that can be expressed by composition formula $(Cu_{1-x}Tl_x)Ba_{1-y}Sr_yCa_2Cu_3O_z$ where $0 \leq x \leq 1$, $0 \leq y \leq 1$, and $0<z$.

4. A method of making a thin film structure having columnar pinning centers comprising steps of forming insularly on a substrate, nano dots or nano stripes shaped three-dimensionally; said nano dots or nano stripes comprising a material selected from the group consisting of Ag, Mg and Zn, depositing a superconducting material on said substrate and on said nano dots or said nano stripes to form amorphous or non-superconducting columnar defects on said nano dots or nano stripes and to form superconducting thin film on those areas on the substrate other than where said nano dots or nano stripes have been formed:

wherein said substrate is the substrate of $SrTiO_3$, MgO, or $Al_2O_3$, or a substrate having a buffer layer of $CeO_2$ formed thereon; and said superconducting thin film composed of a selective reduction type high temperature superconductor that is of a (Cu, M) high temperature superconducting material which can be expressed by the following composition formula:

$Cu_{1-x}M_x(Ba_{1-y}Sr_y)_2(Ca_{1-z}L_z)_{n-1}Cu_nO_{2n+4-w}$ where M represents one or more metallic elements in an ionic form selected from the group that consists of Tl, Bi, Pb, Hg, In, Ga, Sn, Ti, V, Cr, Mn, Fe, Co, Ni, Zr, Nb, Mo, W, Re, and Os; and L represents one or more elements selected from the group that consists of Mg and alkali metal elements, and where $0 \leq x \leq 1.0$, $0 \leq y \leq 1.0$, $0 \leq z \leq 1$, $0 \leq w \leq 4$, and $1 \leq n \leq 16$.

5. A superconducting thin film structure having columnar pinning centers and comprising:

a substrate;

nano dots or nano stripes which are formed insularly on the substrate and three-dimensionally in shape, said nano dots or nano stripes comprising a material selected from the group consisting of Ag, Mg and Zn;

amorphous or non-superconducting columnar defects composed of a superconducting material and grown on said nano dots or nano stripes, respectively;

a lattice defect which is formed on said amorphous or non-superconducting columnar defects;

a superconducting thin film composed of said superconducting material formed in those areas on said substrate which are other than those where said columnar defects are formed;

wherein said substrate is a substrate of $SrTiO_3$, MgO or $Al_2O_3$, or a substrate having a buffer layer of $CeO_2$ formed thereon; and said superconducting thin film is a superconducting thin film that can be expressed by composition formula: $(Cu_{1-x}Tl_x)Ba_{1-y}Sr_yCa_2Cu_3O_z$ where $0 \leq x \leq 1$, $0 \leq y \leq 1$, and $0<z$.

6. A superconducting thin film structure having columnar pinning centers and comprising:

a substrate, nano dots or nano stripes which are formed insularly on the substrate and three-dimensionally in shape and composed of a material other than a superconducting material and also other than a material of which the substrate is formed, amorphous or non-superconducting columnar defects composed of a superconducting material and grown on said nano dots or nano stripes, respectively, a lattice defect which is formed on said amorphous or non-superconducting columnar defects, and a superconducting thin film composed of said superconducting material formed in those areas on said substrate which are other than those where said columnar defects are formed;

wherein said substrate is a substrate of $SrTiO_3$, MgO or $Al_2O_3$, or a substrate having a buffer layer of $CeO_2$ formed thereon; said material being other than said superconducting material is Ag, Mg or Zn; and said superconducting thin film is composed of a selective reduction type high temperature superconductor that is a (Cu, M) high temperature superconducting material which can be expressed by the following composition formula:

$Cu_{1-x}M_x(Ba_{1-y}Sr_y(Ca_{1-z}L_z)_{n-1}Cu_nO_{2n+4-w}$ where M represents one or more metallic elements in an ionic form selected from the group that consists of Tl, Bi, Pb, Hg, In, Ga, Sn, Ti, V, Cr, Mn, Fe, Co, Ni, Zr, Nb, Mo, W, Re and Os; and L represents one or more elements selected from the group that consists of Mg and alkali metal elements, and where $0 \leq x \leq 1.0$, $0 \leq y \leq 1.0$, $0 \leq z \leq 1$, $0 \leq w \leq 4$, and $1 \leq n \leq 16$.

* * * * *